United States Patent [19]

Li et al.

[11] Patent Number: 5,086,276

[45] Date of Patent: Feb. 4, 1992

[54] METHOD OF DETERMINING CONDENSATE LOCATION IN AN HID LAMP

[75] Inventors: Yan M. Li, Cambridge; A. Bowman Budinger, Westford; Wojciech W. Byszewski, Concord; Philip Gregor, Acton; William M. Keeffe, Rockport, all of Mass.

[73] Assignee: GTE Laboratories Incorporated, Waltham, Mass.

[21] Appl. No.: 696,659

[22] Filed: May 7, 1991

[51] Int. Cl.$^5$ .............................................. G01R 31/24
[52] U.S. Cl. ................................. 324/414; 324/403; 445/3
[58] Field of Search .................... 324/403, 414; 445/3, 445/18

[56] References Cited

U.S. PATENT DOCUMENTS 4,823,050  4/1989  English et al. .................. 445/18

Primary Examiner—Kenneth A. Wieder
Assistant Examiner—Diep Do
Attorney, Agent, or Firm—Carl F. Ruoff

[57] ABSTRACT

The present disclosure describes a method for determining the condensate location within an HID lamp. The method involves monitoring current and voltage waveforms during the glow phase of lamp starting. If the voltage drop during the glow phase is low with a corresponding high current, then the volatile component of the lamp fill has condensed on the electrodes during the previous cool down period. If the voltage drop is high and current is low then most of the condensate has localized on the arc tube wall. An automated detection apparatus is used to carry out the measurements to determine condensate location.

4 Claims, 5 Drawing Sheets

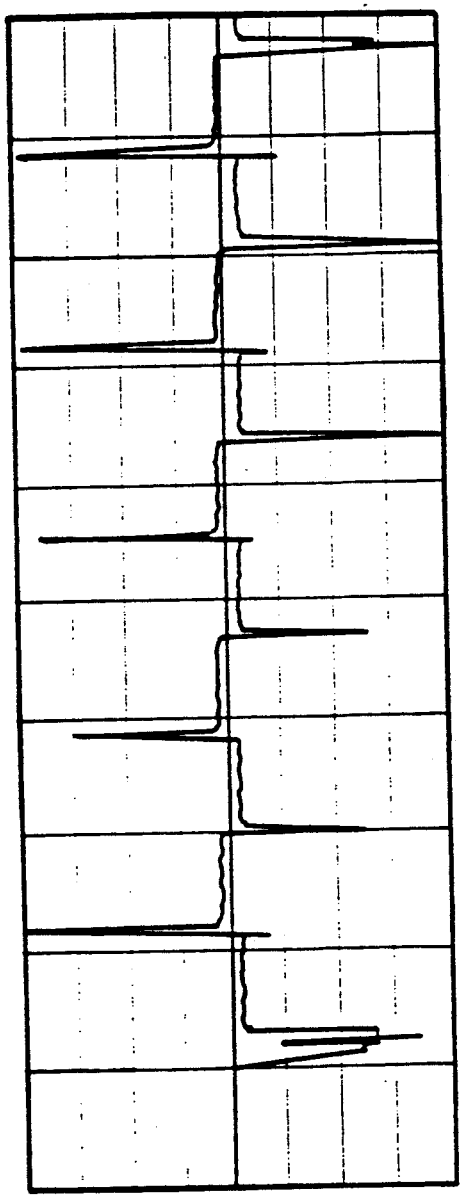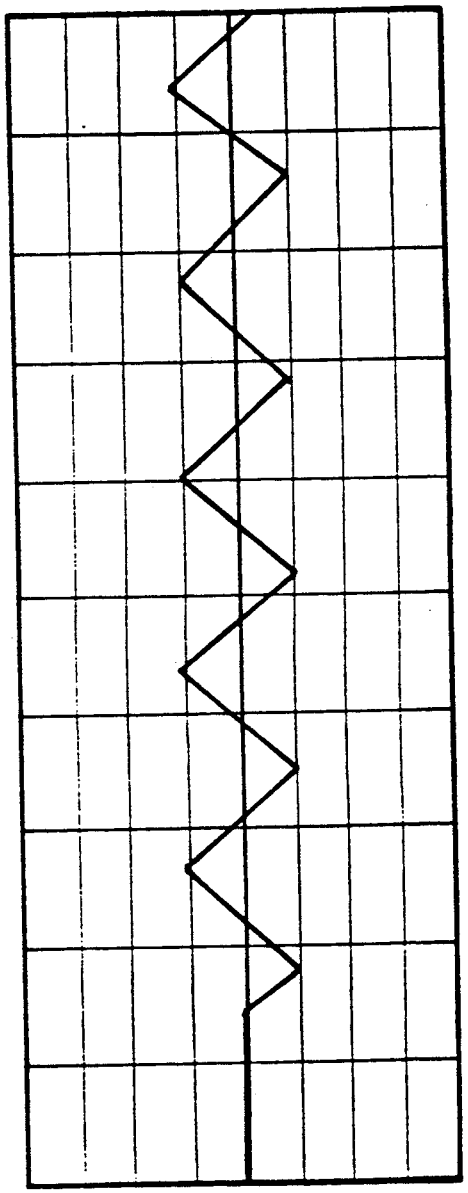
VOLTAGE (100V/DIV)  CURRENT (2A/DIV)
TIME (10 MSEC/DIV)
FIG.2

METHOD OF DETERMINING CONDENSATE LOCATION IN AN HID LAMP

BACKGROUND OF THE INVENTION

The present invention describes a technique for determining location of condensates within lamps.

The location of condensate within the HID lamp prior to starting is a matter of importance to lamp designers. The ability to identify the location of condensates provides lamp designers with additional information with which they may evaluate lamp performance during starting with respect to design specifications.

One example of controlling lamp condensate location is found in U.S. Pat. No. 4,823,050, where an arc tube is designed which provides a heat reflective coating on the outside surface of the bottom region of the arc tube. By reflecting heat into certain areas of the arc tube, other areas are kept cooler and this is where a lamp fill additive will condense.

The present invention is a method for determining whether the condensate is on the lamp electrodes or the arc tube surface.

SUMMARY OF THE INVENTION

The present invention describes a method of determining condensate location within an HID lamp. The method comprises comparing a first current waveform and a first voltage waveform during the glow phase of lamp starting when the lamp electrodes are free of condensate with a second current and a second voltage waveform during the glow phase of the tested HID lamp. From this comparison it is determined whether the condensate is on the lamp electrodes or on the arc tube surface.

This method of determining condensate location within an HID lamp comprises monitering the current and voltage waveforms during the glow phase of lamp starting. A first counter is triggered at every zero crossing point counting number $N_1$. A second counter counting number $N_2$ is triggered at a predetermined delay from every zero crossing of the current when the measured rectified voltage is lower than a predetermined voltage value.

The $N_2/N_1$ ratio is calculated after $N_1$ has reached a predetermined number. If $N_2/N_1$ is between 0.5 to 1.0 both electrodes are covered with condensate. If $N_2/N_1$ is below about 0.5 and greater than about 0.1, one electrode is covered with condensate. Finally, if $N_2/N_1$ is less than about 0.1 neither electrode is covered with condensate.

BRIEF DESCRIPTION OF THE DRAWING

FIG. 2 shows glow phase voltage and current waveforms for a 100 W metal halide lamp where the electrodes are covered with condensate;

For a better understanding of the present invention together with other objects, advantages and capabilities thereof, reference is made to the following description and appended claims in connection with the above-described drawing.

DESCRIPTION OF THE PREFERRED EMBODIMENT

Figure 1:
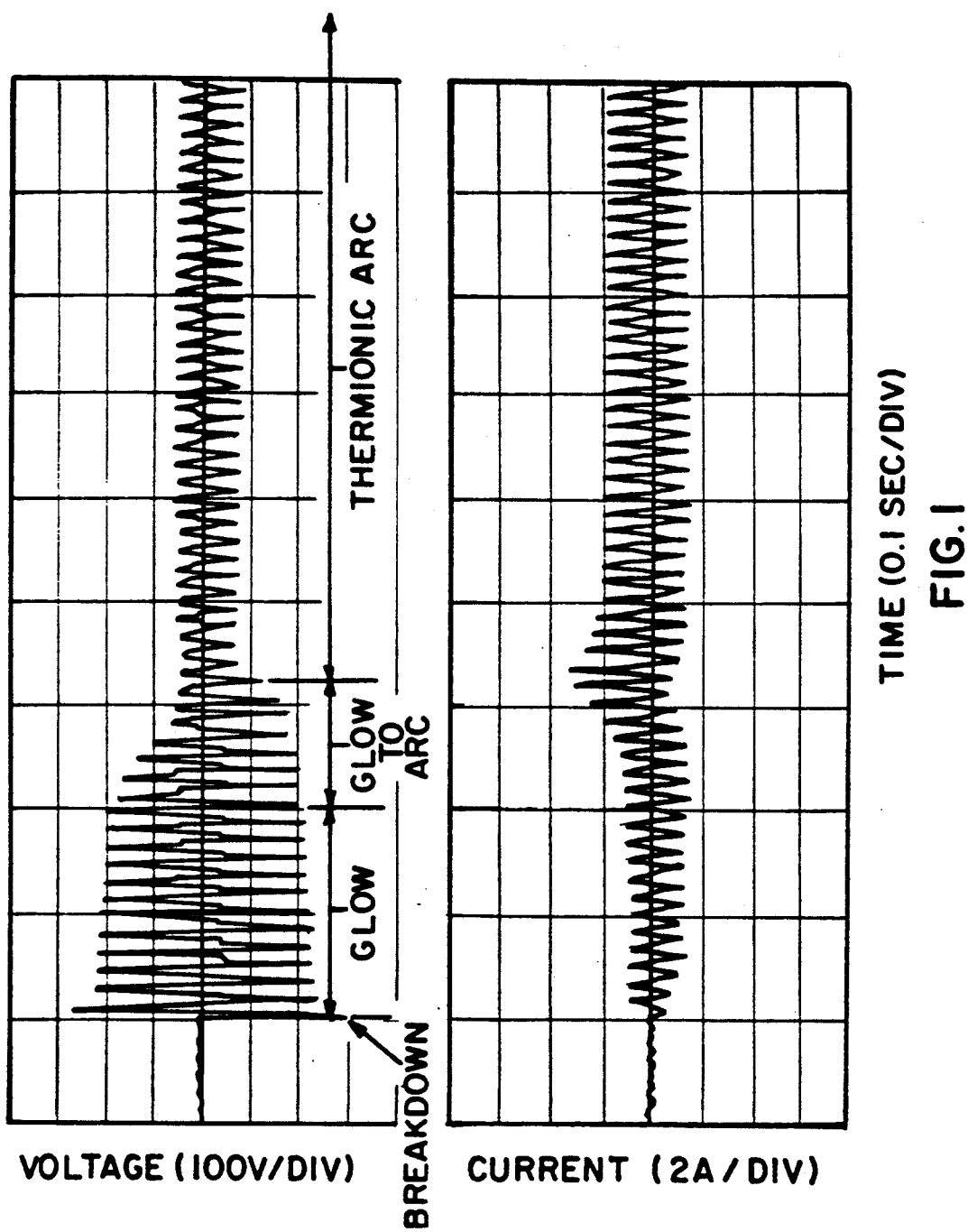
FIG. 1 shows current and voltage waveforms during the starting of a 100 W metal halide lamp.
Figure 3:
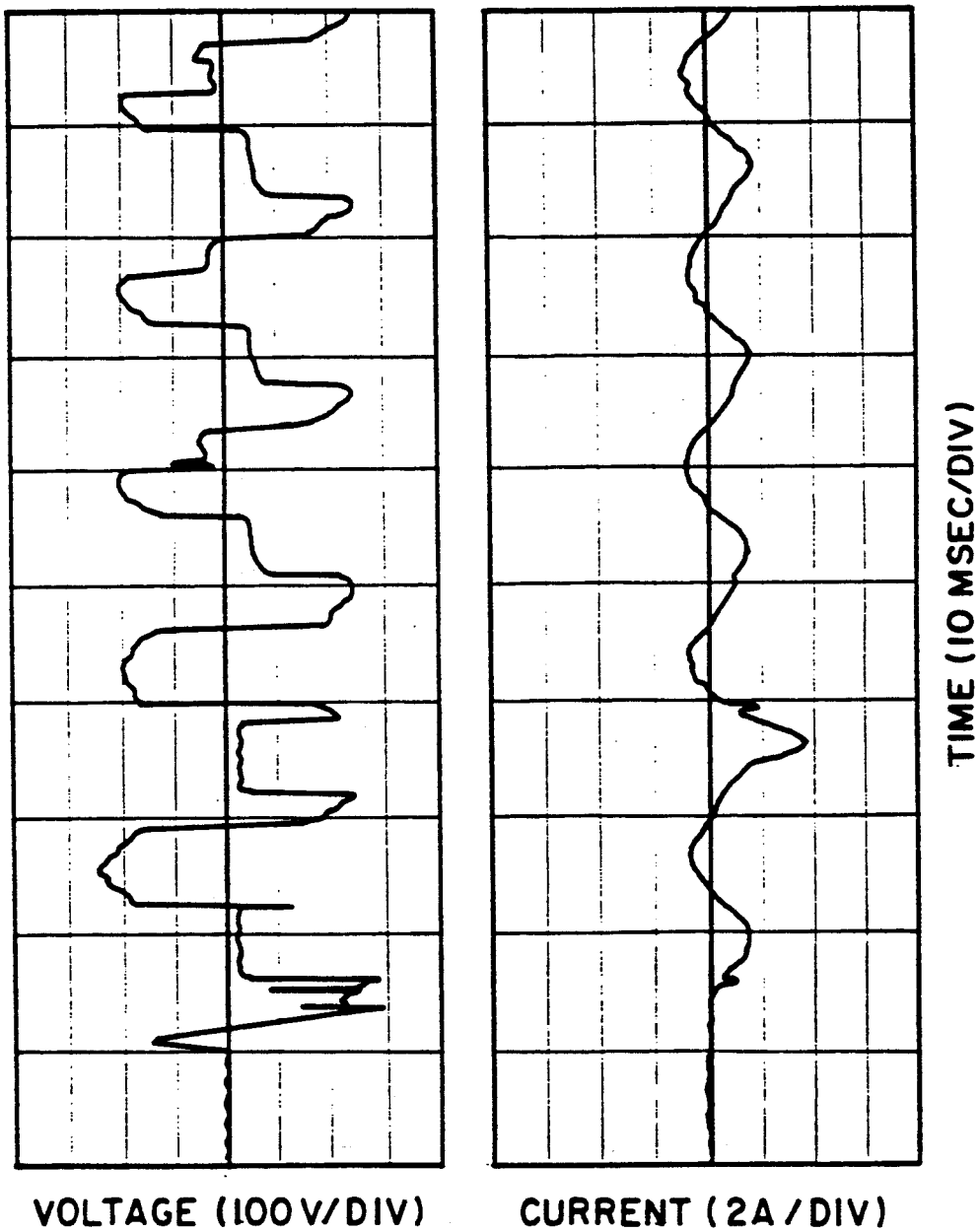
FIG. 3 shows glow phase voltage and current waveforms for a 100 W metal halide lamp where the electrodes clean of condensate.

The starting of an HID lamp consists of several phases: breakdown, glow, glow-to-arc and thermionic arc. FIG. 1 shows voltage and current waveforms during the starting of 100 W metal halide lamp. All four phases of starting are indicated (breakdown, glow, glow-to-arc, thermionic arc). FIG. 2 shows expanded glow phase voltage and current waveforms for a 100 W metal halide lamp having electrodes covered with condensate. Technically, the initial discharge that occurs during HID lamp starting with electrodes covered with condensate is not glow, however for purposes of this application the glow phase in lamp starting refers to the period between breakdown and glow-to-arc transition whether the electrodes are covered with condensate or not. The extremely low voltage and high current waveforms seen during this time period are thought to be due to a higher number density of ionizable species (mostly mercury) removed from the electrodes and driven into the vapor phase. FIG. 3 shows glow phase waveforms from the same lamp after the electrodes have been cleaned of almost all condensate. The voltage across the lamp remains high during the main portion of each half cycle. In contrast, the voltage collapsed to a very low value early in each half cycle when condensate covered the electrodes. The transition to thermionic arc (glow-to-arc) starts at the moment the electrodes are totally cleared of all condensate. Thus, by exploiting the difference in current and voltage waveforms during the glow phase of lamp starting, one can readily determine the condensate location within the lamp.

Figure 4:
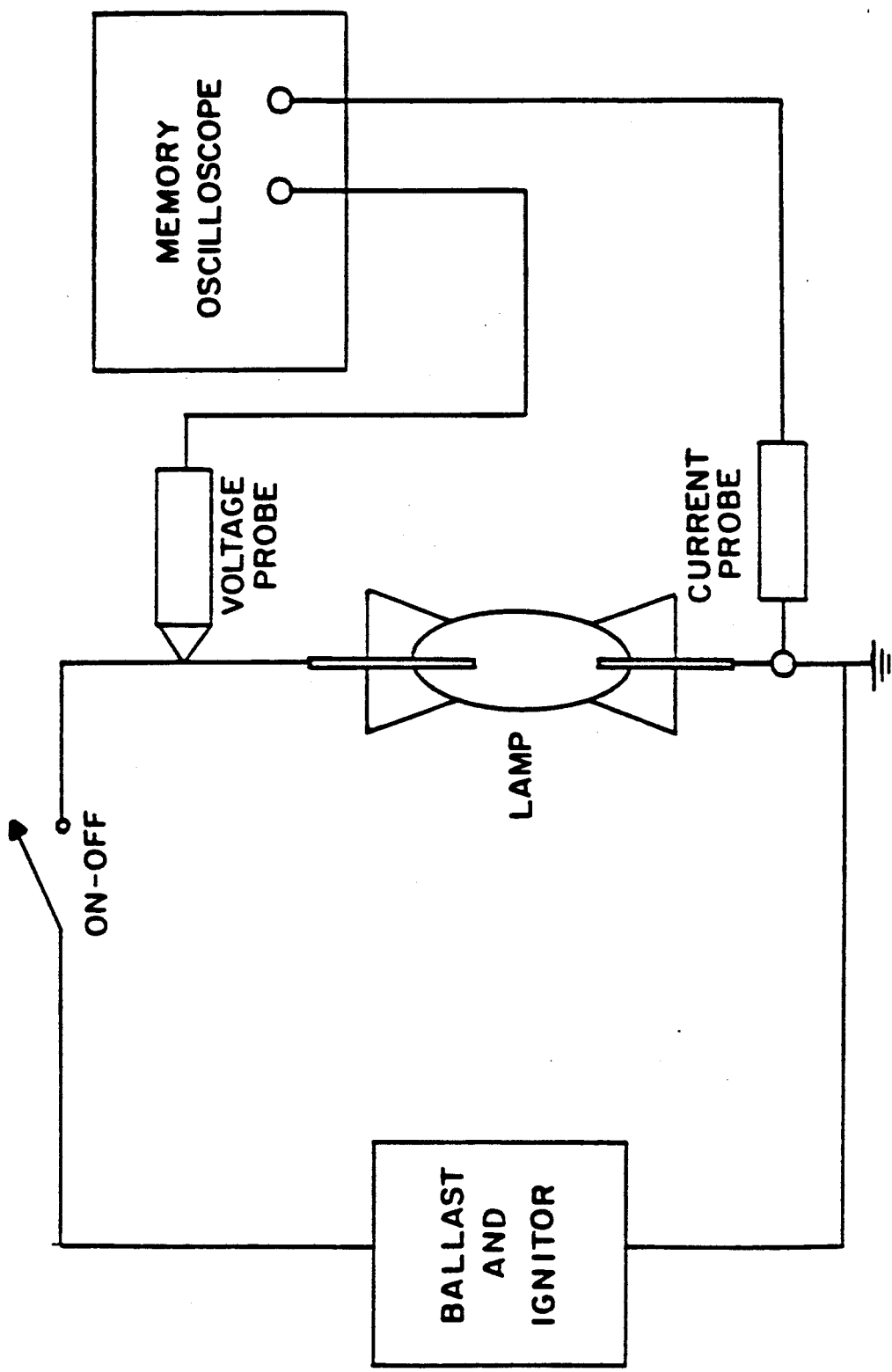
FIG. 4 shows a schematic for measuring current and voltage waveforms for various lamps and storing this data in useable form.

A typical circuit for the acquisition of these waveforms is shown in FIG. 4. The 100 W metal halide lamp, in this case, is operated from a conventional ballast and ignitor which is included to provide high voltage starting pulses. The Advance M90 ballast and ignitor which produces 277 V(rms) open circuit, 1.1 A (rms) short circuit current and 5-8 starting pulses (per half cycle) each 3.5 kV in magnitude and 4 μsec in duration was used in the present invention. Current and voltage waveforms are obtained from a current probe and high voltage probe attached to the operating circuit in a manner shown in FIG. 4. A Tektronik AM503 can be used for the current probe and a Tektronik P6015 can be used for the voltage probe. The outputs of these probes are directed to two input channels of a storage oscilloscope. It is convenient to use a LeCroy 9400 storage oscilloscope due to its rather large memory depth. The oscilloscope is triggered from the voltage waveform in order to synchronize both channels properly. The voltage waveforms observed during the glow phase of starting are either those pictured in FIG. 2 or those pictured in FIG. 3. In general, glow discharge waveforms characteristic of those where the electrode is covered with condensate (FIG. 2) are followed in time by waveforms characteristic of those from clean electrodes (FIG. 3). This is due to the vaporization of the condensate which occurs as the electrodes heat up. This indicates that the cleaning process is complete and the lamp will shortly go into the thermionic arc phase.

If the voltage drop during the glow phase is very low and has a correspondingly high current, then much or all of the volatile component of the fill condensed on the electrode during the previous cool down period. In this case, the glow phase portion of the starting process is lengthened. If a glow discharge with predominately high voltage and low current is observed then most of the condensate has localized itself on the arc tube wall during the last cool down. The glow phase in this case is relatively short.

By examining the voltage and current waveforms during lamp starting and particularly the glow phase a lamp designer can verify that the condensate has located itself on the electrodes or on the arc tube wall.

The scope of this invention is not limited to the visual diagnosis of the electrical waveforms from an oscilloscope but extends to associated discrimination circuitry which would provide pass/fail outputs utilized in automated manufacturing control systems in computer aided manufacturing. The pass/fail output of the discrimination circuitry would identify lamps within each production batch which possess condensation properties other than expected. A block diagram for a discrimination circuit based upon the starting characteristics of 100 W metal halide lamps, is given in FIG. 5. Here, a signal from the current probe is directed to a zero-crossing detector. Outputs from the zero crossing circuit go both to counter 1 which determines the number of elapsed half cycles, $N_1$, and to trigger the sampling of the voltage probe signal. This second output is delayed for example, 2.5 msec and has an on time window of up to 4.0 msec. It has to be delayed at least a few msec to avoid interference from oscillations which often appear at the leading edge of each half cycle. The voltage signal is sent through a full wave rectifier and compared with a preset DC voltage of 30 V chosen to be suitable for metal halide lamps operated by ballasts with short circuit currents higher or about 1 amp. In all other cases this DC voltage should be chosen individually for each lamp-ballast system. If the voltage signal is less than 30 V, counter 2 is triggered and a low voltage event is registered. The whole recording procedure continues until $N_1$ reaches a preset number of half cycles. Then the total number of low voltage events, $N_2$, is recorded. Since only the glow discharge phase is of concern, the glow-to-thermionic arc transition has to be avoided. For example, $N_1$ for the case shown in FIG. 1 should be about 20. Although this discrimination circuit uses parameter values derived from 100 W metal halide lamps, with suitable parametric adjustments, this circuit can be used for other lamps as well.

The ratio ($N_2/N_1$) determines the presence of condensate. In an ideal situation, two electrodes are covered with condensate if ($N_2/N_1$)=1 and one electrode is covered with condensate if ($N_2/N_1$)=0.5. When no condensate is on either electrode then ($N_2/N_1$)=0. In reality, small traces of condensate may be present on a presumably clean electrode and are removed in one or two discharge cycles. If ($N_2/N_1$) is less than 0.1 both electrodes can be considered clean.

Figure 5:
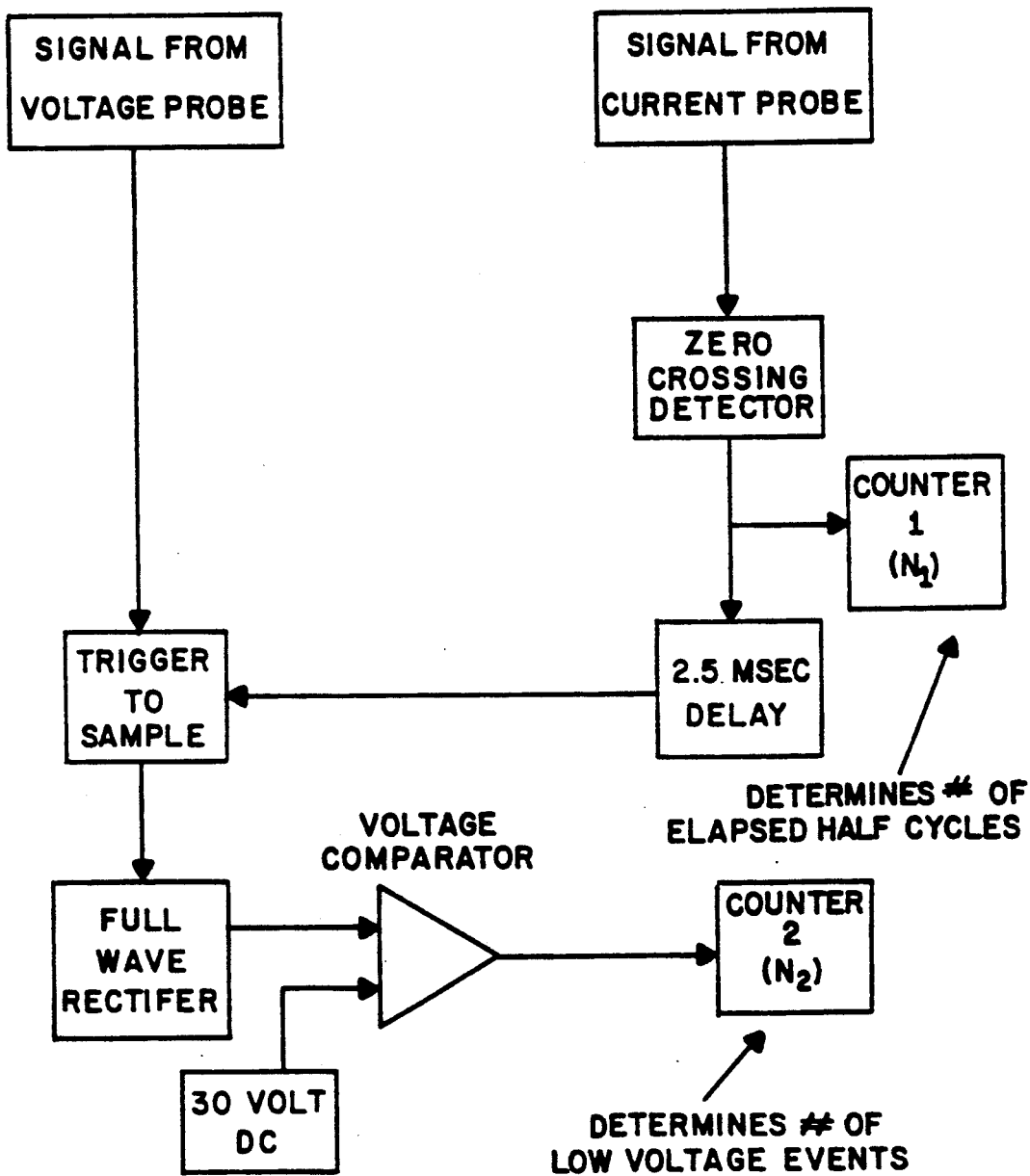
FIG. 5 shows a schematic diagram for detecting condensate location within a metal halide lamp.

Volatile species within the arc tube condense, over a period of many minutes, on the coolest point. Subtle changes in arc tube or electrode cooling rates can have a significant effect on the distribution of condensate. This invention relates to a unique method of determining the condensate location within the arc tube of an HID lamp. This method, as described in this application, can be used in its simplest form (shown in FIG. 4) to evaluate developmental HID lamps or in its more complex form (an example of which is shown in FIG. 5) to monitor arc tube condensate location in a production environment.

Although the present invention is concerned with determining condensate location, different arc tube lamps have different requirements so preferred condensate location is lamp dependent. Thus, the present invention allows one to non-destructively evaluate potential lamp designs to determine condensate location.

While there has been shown and described what are at present considered the preferred embodiments of the invention, it will be obvious to those skilled in the art that various alterations and modifications may be made therein without departing from the scope of the invention.

What is claimed

1. A method of determining condensate location within an HID lamp comprising:
   measuring a first current and a first voltage waveform during the glow phase of lamp starting when the lamp electrodes are free of condensate;
   measuring a second current and a second voltage waveform during the glow phase of lamp starting and comparing the first current waveform with the second current waveform and the first voltage waveform with the second voltage waveform to determine the condensate location.

2. A method of determining condensate location within a HID lamp comprising:
   measuring the current during the glow phase of lamp starting and triggering a first counter at every zero crossing of the current counting number $N_1$;
   measuring the rectified voltage during the glow phase at a predetermined delay from every zero crossing of the current and comparing this with a predetermined voltage and triggering a second counter if the rectified voltage is less than the predetermined voltage counting number $N_2$;
   determining the $N_2/N_1$ ratio after $N_1$ has reached a predetermined number wherein both electrodes are covered with condensate if $N_2/N_1$ is from about 0.5 to 1.0, one electrode is covered with condensate if $N_2/N_1$ is below 0.5 and greater than 0.1 and neither electrode is covered with condensate if $N_2/N_1$ is less than approximately 0.1.

3. The method according to claim 1 wherein the HID lamp is a 100 watt metal halide lamp powered by an Advance M90 ballast.

4. The method according to claim 2 wherein the HID lamp is a 100 watt metal halide lamp powered by an Advance M90 ballast.

* * * * *